United States Patent [19]

Wang et al.

[11] Patent Number: 5,171,712

[45] Date of Patent: Dec. 15, 1992

[54] METHOD OF CONSTRUCTING TERMINATION ELECTRODES ON YIELDED SEMICONDUCTOR DIE BY VISIBLY ALIGNING THE DIE PADS THROUGH A TRANSPARENT SUBSTRATE

[75] Inventors: Tsing-Chow Wang, San Jose; Louis H. Liang, Los Altos, both of Calif.

[73] Assignee: VLSI Technology, Inc., San Jose, Calif.

[21] Appl. No.: 811,755

[22] Filed: Dec. 20, 1991

[51] Int. Cl.⁵ .................. H01L 21/285; H01L 21/283; H01L 21/31

[52] U.S. Cl. .................................... 437/183; 437/203; 437/924; 437/974

[58] Field of Search ............... 437/183, 203, 229, 924, 437/925, 944, 974, 984; 148/DIG. 100, DIG. 102, DIG. 104, DIG. 135

[56] References Cited

FOREIGN PATENT DOCUMENTS

| 60-86853 | 5/1985 | Japan | 437/183 |
|---|---|---|---|
| 60164867 | 2/1987 | Japan | 437/183 |
| 63-9942 | 1/1988 | Japan | 437/944 |
| 63-291428 | 11/1988 | Japan | 437/183 |
| 2-54932 | 2/1990 | Japan | 437/183 |

OTHER PUBLICATIONS

Jacobs, S. L., et al., "A Multi-Chip Technology on a Stretched Polyimide Film," Polylithics, Inc., *Proceedings, NEPCON West* 1990, Anaheim, California, pp. 984–993, Feb. 26–31, 1990.

Johnson, T. K., "The Flexible Leaded Component (FLC): Reliable 'Bare-Chip' Packaging," UniStructure, Inc., *9th Annual IEPS Conference,* San Diego, California, pp. 742–753, Sep. 11–Sep. 13, 1989.

*Primary Examiner*—Olik Chaudhuri
*Assistant Examiner*—David E. Graybill
*Attorney, Agent, or Firm*—Majestic, Parson, Siebert & Hsue

[57] ABSTRACT

A process for fabricating conductive bumps on the bond pads of yielded good die includes forming a transparent structure upon which a masking layer is formed, aligning yielded good die and attaching them to the masking layer, and attaching a backing material to the backside of the die for mechanical support. The transparent structure is then removed and fabrication of the bumps continued on the bond pads of the good die by conventional means.

16 Claims, 4 Drawing Sheets

METHOD OF CONSTRUCTING TERMINATION ELECTRODES ON YIELDED SEMICONDUCTOR DIE BY VISIBLY ALIGNING THE DIE PADS THROUGH A TRANSPARENT SUBSTRATE

BACKGROUND

This invention relates in general to integrated circuit ("IC") packaging techniques and in particular, to a method of constructing termination electrodes on yielded semiconductor die.

Tape Automated Bonding ("TAB") is an effective and established means of reliably forming high density packaging. The TAB method uses a thermal bonding technique to bond inner leads formed on a film carrier to bumps typically formed on the bond pads of an integrated circuit ("IC") chip.

A critical process and a key element in the successful use of TAB is proper formation of the bumps which serve to not only electrically connect the film carrier leads to the IC bond pads, but also to mechanically connect them. Early efforts at forming bumps on the IC bond pads focused on conventional wafer processing techniques. See, e.g., Liu, T. S. et al, "A Review of Wafer Bumping for Tape Automated Bonding," *Solid State Technology*, March 1980.

Although wafer processing often provides certain economies of scale through the batch processing of die, wafer processing of bumps can be inordinately expensive and its cost can exceed those economies of scale when gold or other expensive, high purity material is used as the bump material. This is because wafer processing indiscriminately forms gold bumps on the bad die, as well as, the good die of the wafer. The processing of large ICs is especially expensive, because of the smaller number of gross die and the smaller percentage of good die on the wafer being processed.

TAB, however, was developed as a packaging and mounting technique for handling large ICs with a large number of input and output ("I/O") bond pads. Thus, as ICs get larger, making TAB more attractive, the wafer processing cost of placing gold or other expensive, high purity material bumps on the IC bond pads rises exponentially with yield loss.

Alternative approaches to bump fabrication by continuing to process the IC wafer have therefore been pursued. One such approach is to eliminate the requirement of bumping the IC in favor of bumping the leads on the film carrier. See, e.g., Hatada, Kenzo et al, "Bump Property for High Bondability and Reliability in Transferred Bump Tab Assembly Technology," *IMC 1988 Proceedings*, Tokyo, May 25-27, 1988.

Bumping the film carrier leads, however, can also be unduly expensive for high volume production requirements since only one set of leads, corresponding to only one IC, can be fabricated at a time. Thus, although this technique solves the problem of wasting gold or other expensive, high purity bump material on bad die, it loses the cost advantages due to economies of scale provided by a batch processing fabrication method wherein many die are processed together at the same time such as in wafer processing.

SUMMARY OF THE INVENTION

Accordingly, one object of the present invention is to provide a method by which bumps may be cost effectively and reliably fabricated on the IC bond pads of only yielded good die.

A second object of the present invention is to provide a method by which bumps may be fabricated on the IC bond pads of more than one yielded good die at a time.

These and additional objects are accomplished by the various aspects of the present invention. One aspect of the invention accomplishes one or more of these objects by a new process for fabricating conductive bumps on the bond pads of yielded good die.

Briefly stated, the process starts by first constructing a transparent structure upon which a masking layer is subsequently formed. Holes are fabricated in the masking layer at predetermined locations corresponding to the locations of the bond pads of a predetermined number of yielded good die which will later be attached to the masking layer.

After fabrication of the holes in the masking layer, the yielded good die are then optically aligned against the surface of the masking layer by matching the locations of their bond pads to the predetermined locations of their corresponding holes in the masking layer. Once aligned, the yielded good die are then attached to the surface of the masking layer by an adhesive material.

After the yielded good die have been properly aligned on and attached to the masking layer, the transparent structure is then separated and/or removed from the opposite side of the masking layer. With the transparent structure thus removed, conductive bumps are then formed on the bond pads of the yielded good die through the holes of the masking layer by conventional means.

Finally, once the conductive bumps are formed on the bond pads of the yielded good die, the masking layer is then removed from the die to complete the process. The yielded good die are then ready to be attached to the film carrier leads by conventional means.

In addition to the above process, the yielded good die can also be attached to a backing material either before or after they have been attached to the masking layer. The backing material functions as a mechanical support for the yielded good die after the transparent structure has been removed from the masking layer.

If the backing material is supporting multiple yielded good die, the resulting structure can be processed just like a wafer consisting of all good die. Thus, the economies of scale achieved through wafer processing techniques can be realized.

The backing material also provides mechanical support for the bumped die after the masking layer has been removed. This allows the die to then be electrically probed, similar to wafer probing, prior to attaching the die to the carrier film leads. Consequently, if any of the die have been damaged during the bumping process, or have failed to have the bumps properly processed on them, they can be discarded prior to packaging. Thus, this additional probing test can also significantly reduce overall packaging costs.

Finally, after the die have been probed, the tested good die could then be detached from the backing material using conventional methods such as dicing or solvent removal of the adhesive, and attached to the carrier film leads for TAB mounting. Alternatively, the backing material might be diced along with the die and remain attached to the die to function as a heat sink.

Additional objects, features and advantages of the various aspects of the present invention will become apparent from the following description of its preferred

DETAILED DESCRIPTION OF THE PREFERRED EMBODIMENT

Figure 1:
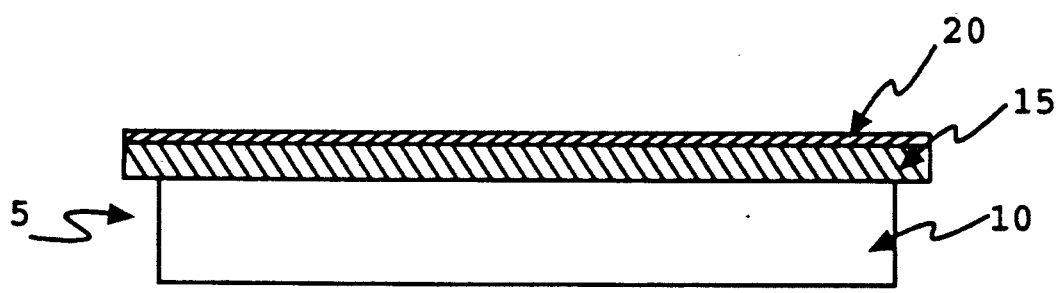
FIG. 1 illustrates the first step, forming a transparent structure, of a twelve step process utilizing aspects of the present invention.

FIG. 1 illustrates the formation of a transparent structure 5 upon which a masking layer and a number of yielded good die will later be attached. The transparent structure 5 is formed in this example by starting with a sheet of glass 10 and applying on one of its surfaces a thin flexible layer of material 15, such as a pellicle, which acts as a backing material. On the opposite surface of the flexible layer 15, a thin layer of metallic material 20 is then formed by evaporation or sputtering to act as a release agent.

Both the flexible layer of material 15 and the thin layer of metallic material 20 are to be transparent. The flexible layer of material 15 is made transparent by proper choice of material. The thin layer of metallic material 20, on the other hand, is made transparent by fabricating its thickness a thin layer of only a few monolayers thick.

Figure 2:
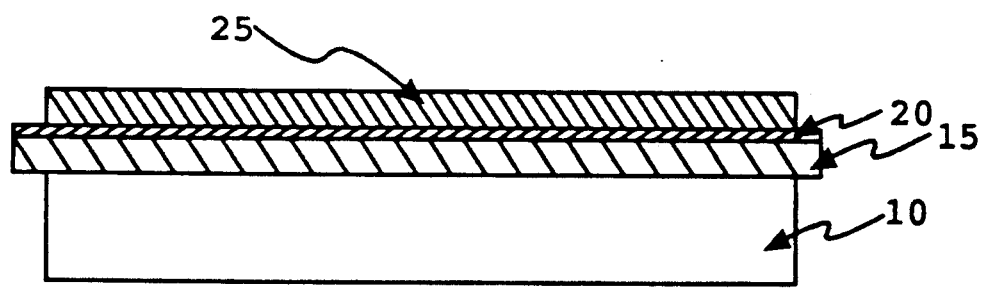
FIG. 2 illustrates the second step, depositing a coating of photoresist on the transparent structure, of a twelve step process utilizing aspects of the present invention.

FIG. 2 illustrates the formation of a first masking layer. As an example, a positive photoresist 25 can be formed upon the exposed surface of the layer of thin metallic material 20 by conventional means such as spin coating the photoresist on then curing it. Since the holes which are later to be formed in this masking layer are also used as support walls for forming the Au bumps, the thickness or height of the photoresist 25 is typically around 28-30 $\mu$m in order to be consistent with a typical Au bump height of around 25 $\mu$m.

In lieu of using a photoresist material, alternatively, a photosensitive material such as a photo definable, polyimide could also be used. If a photosensitive material other than a photoresist is used, certain modifications in the process might be required. For example, chromium is a preferable metallic material 20 when a photoresist is used for the masking layer 15, whereas, copper is a preferable metallic material 20 when a photosensitive material such as a polyimide is used for the masking layer 15.

Figure 3:
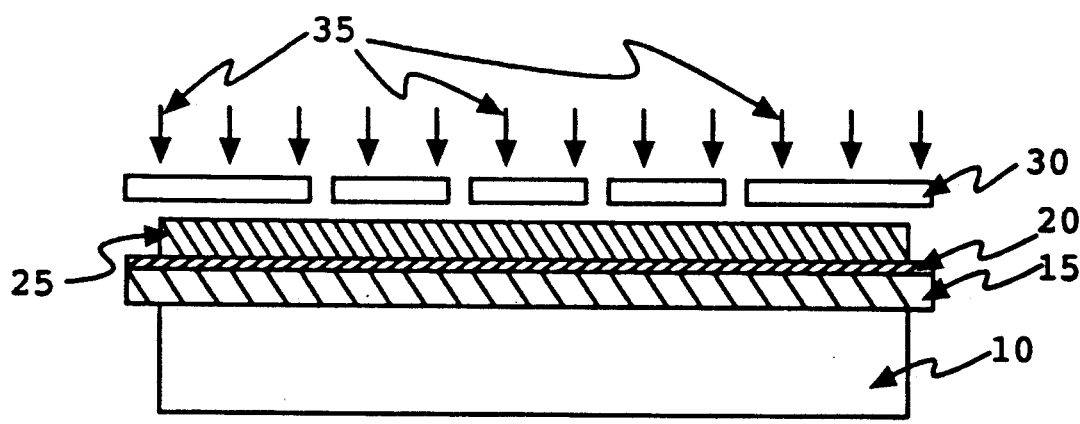
FIG. 3 illustrates the third step, aligning a photomask to the photoresist and exposing the unmasked photoresist to ultraviolet light, of a twelve step process utilizing aspects of the present invention.

FIG. 3 illustrates the formation of the holes 40 (FIG. 4) through which the conductive bumps 70 (FIG. 9) will later be formed. A photomask 30 which has a predetermined pattern of holes which correspond to the pattern of bond pads on one or more die in a subsequent planned placement of the yielded die 45 against the photoresist 25, is aligned with respect to the photoresist 25. Portions of the photoresist 25 which are not masked by the photomask 30 are then exposed to ultraviolet light rays 35.

Figure 4:
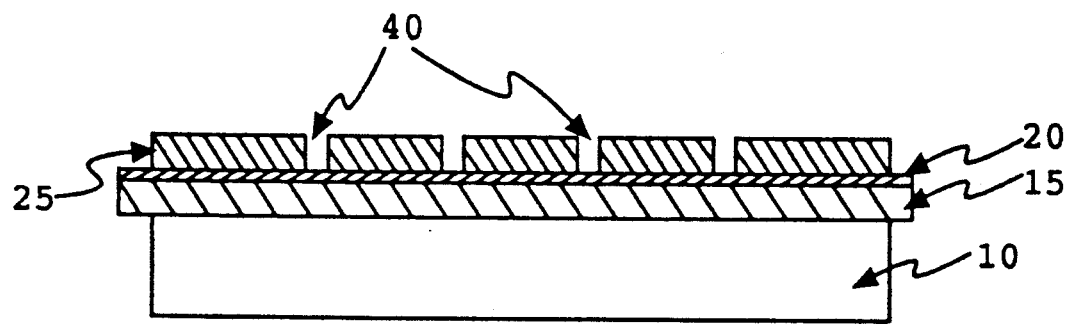
FIG. 4 illustrates the fourth step, developing and removing the exposed portions of the photoresist, of a twelve step process utilizing aspects of the present invention.

FIG. 4 continues with the formation of the holes 40 through which the conductive bumps 70 will later be formed. Using conventional means, the exposed portions of the photoresist 25 are then developed and removed to form the holes 40.

Figure 5:
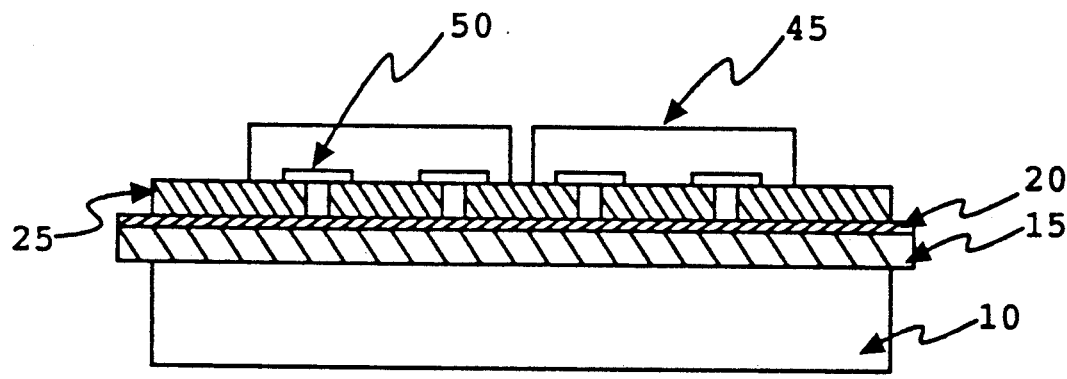
FIG. 5 illustrates the fifth step, aligning and attaching yielded die to the remaining photoresist, of a twelve step process utilizing aspects of the present invention.

FIG. 5 illustrates the placement and attachment of the yielded good die 45 against the photoresist 25. The yielded good die 45 are optically aligned into their proper positions with respect to the photoresist 25 by visually locating the bond pads 50 through the sheet of glass 10, the pellicle 15, the thin metallic material 20, and the holes 40. Since the bond pads 50 and the holes 40 are typically 2-7 mils in dimension, proper alignment of the bond pads and holes can be adequately achieved by conventional optical alignment means. Once all of the yielded good die 45 are thus properly aligned, they are then physically attached to the photoresist 25 by an adhesive material.

Figure 6:
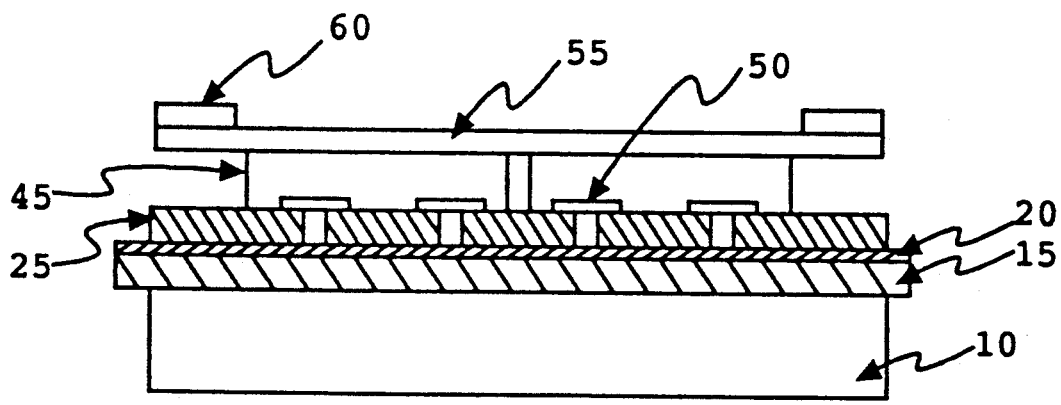
FIG. 6 illustrates the sixth step, applying a thin sheet of backing material and attaching a ring to the backing material, of a twelve step process utilizing aspects of the present invention.

FIG. 6 illustrates the attachment of a backing material 55 to the yielded good die 45 which serves to provide mechanical support to the yielded good die 45 and photoresist 25 after the transparent structure 5 is later removed. Although the backing material 55 illustrated in the example is a thin sheet of material which is mechanically supported by a ring 60, it is not necessarily limited to that by the invention. For example, a conductive sheet of metal which is thick enough so as not to require a support ring might also be used as a backing material.

Figure 7:
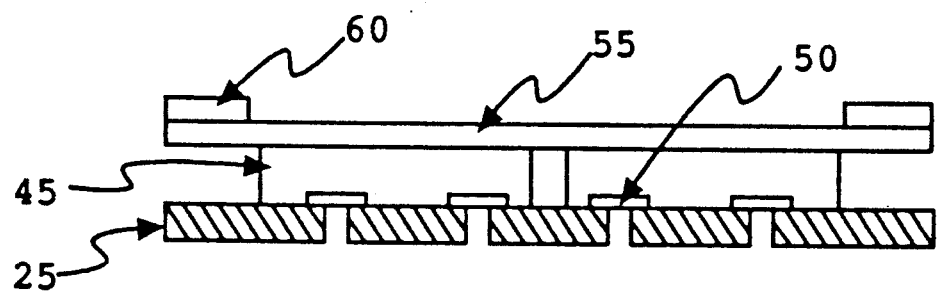
FIG. 7 illustrates the seventh step, peeling off the transparent structure, of a twelve step process utilizing aspects of the present invention.

FIG. 7 illustrates the removal of the transparent structure 5 in preparation for the fabrication of the conductive bumps 70. The transparent structure 5 is removed in steps by first peeling off the glass substrate 10 from the pellicle 15, then releasing the thin metallic material 20 and pellicle 15 from the photoresist 25, and finally, cleaning off any residue of the thin metallic material 20 or pellicle 15 remaining on the photoresist 25. Release of the thin metallic material 20 from the photoresist 25 occurs as a result of having created a high adhesion interface between the metallic material 20 and the pellicle 15, as compared to a weak adhesion interface between the metallic material 20 and the photoresist 25.

Figure 8:
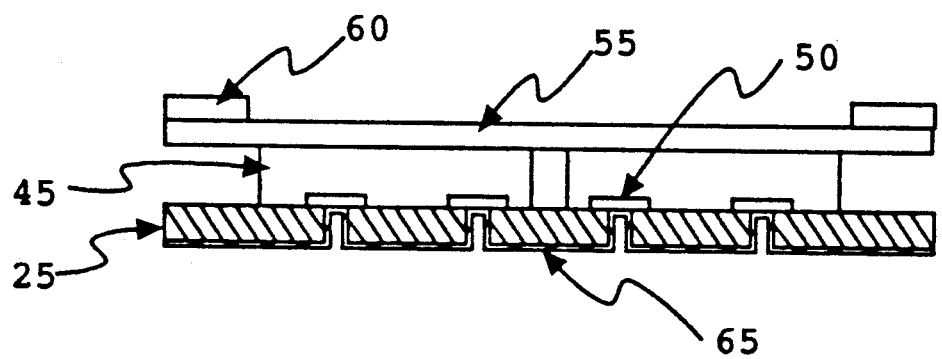
FIG. 8 illustrates the eighth step, back sputtering then depositing a barrier/adhesive base on the photo-resist, of a twelve step process utilizing aspects of the present invention.

With the transparent structure 5 now removed, the yielded good die 45 are ready for bump fabrication. FIG. 8 initiates the bump fabrication process by depositing by conventional means a layer of conventional materials used for an adhesive/barrier base layer 65. These materials might include approximately 3000 Å of a titanium/tungsten alloy ("Ti/W") with an additional layer of approximately 2000 Å of gold ("Au").

Figure 9:
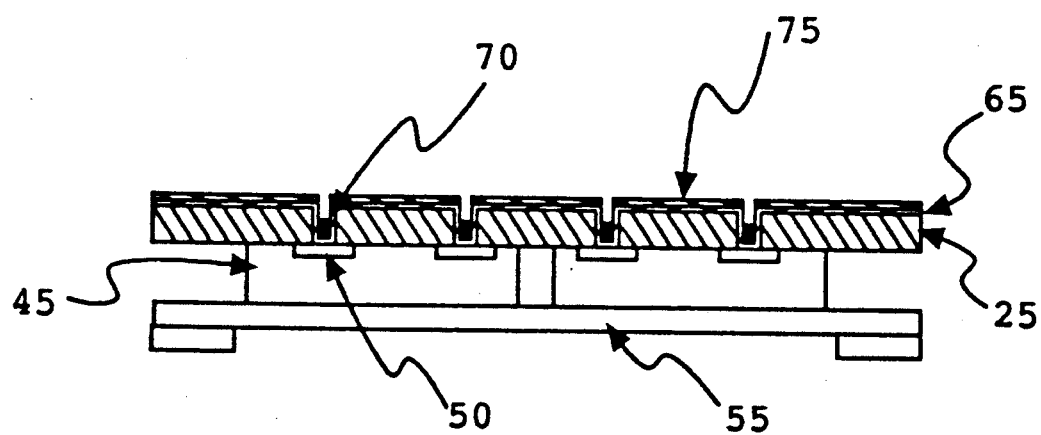
FIG. 9 illustrates the ninth step, plating gold bumps on the die bond pads, of a twelve step process utilizing aspects of the present invention.

FIG. 9 continues the illustrated example of forming the conductive bumps 70. In this and subsequent figures, the structure has been turned upside-down to facilitate illustration of subsequent processing steps. Thus, the backing material 55 is now on the bottom and the photoresist 25 is at the top.

With the adhesive/barrier base layer 65 formed over the bond pads 50, the conductive bumps 70 are then formed by forming a thin photoresist layer 75 over the adhesive/barrier base layer 65, forming holes in the thin photoresist layer 75 where the Au bumps 70 are to be formed, for example, by using the photomask 30, and then electroplating Au onto the resulting bond pad structure. Growth of the gold bumps 70 continues until a desired height is reached. Typically, a height of approximately 25 µm is found to be satisfactory for TAB applications.

A number of comments are worthy of note at this step. First, although Au is used as the bump material in this example, other platable materials such as nickel, copper or silver could also be used.

Second, the photoresist layer 75 need not be as thick as the photoresist layer 25. Since this layer is only being used as a true masking layer, not as support walls for forming the Au bumps like the photoresist layer 25, a typical thickness such as 1 µm is considered to be adequate for this layer.

Finally, although the example describes the Au bumps 70 as being plated onto the bond pads 50, other methods of forming the conductive bumps such as sputtering or evaporative deposition methods, including chemical vapor deposition ("CVD"), could also be used. If sputtering or evaporative deposition methods are used instead of electroplating, certain modifications to the process are required. Since the steps required for these methods are conventional and well known, they will not be elaborated upon in detail.

The primary modifications to the process example that sputtering or evaporative deposition methods would require involve the two photomask steps illustrated in FIGS. 3 and 9 of the example. If these two alternative methods are used instead of electroplating, the first masking layer 25 (FIG. 3) would not have to be a "thick" masking layer, because the layer would not be used as support walls for forming the conductive bumps 70 (FIG. 9). Instead, a contacting metal mask which would replace the second masking layer 75 (FIG. 9) would be used as support walls. Thus, the first masking layer 25 (FIG. 3) would be on the order of 0.5 to 2.0 µm thick instead of the 28–230 µm required in the electroplating process. Following formation of the conductive bumps 70 (FIG. 9), the contacting metal mask which has replaced the second masking layer 75 (FIG. 9), would then be peeled off by conventional means.

Figure 10:
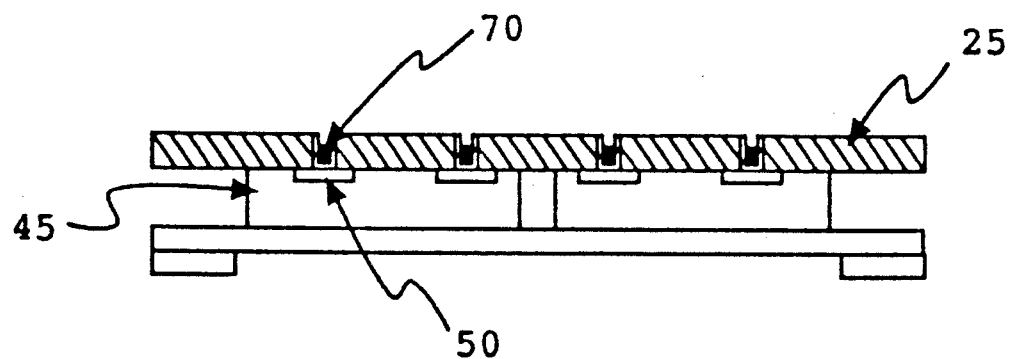
FIG. 10 illustrates the tenth step, removing the barrier/adhesive base, of a twelve step process utilizing aspects of the present invention.
Figure 11:
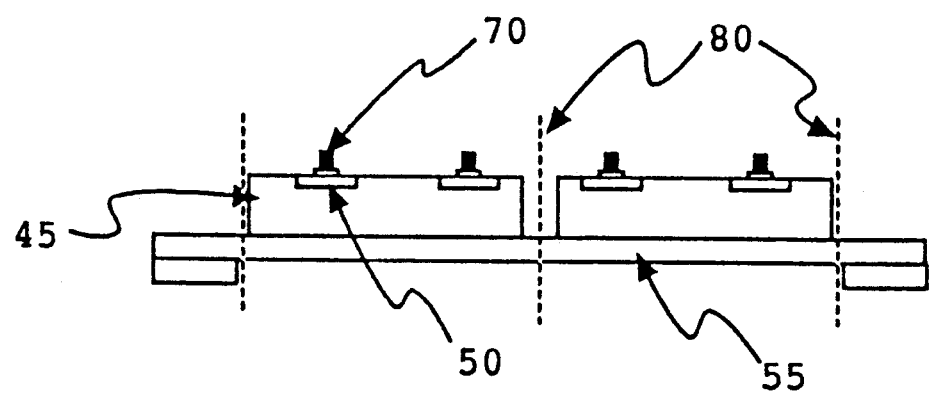
FIG. 11 illustrates the eleventh step, removing the photoresist, of a twelve step process utilizing aspects of the present invention.

FIG. 10 and 11 complete the illustrated process of forming the conductive bumps 70. With the gold bumps 70 now formed on the bond pads 50 of the yielded good die 45, FIG. 10 illustrates the removal of the thin photoresist layer 75 and the adhesive/barrier base layer 65 from the surface of the photoresist 25 and FIG. 11 illustrates the final removal of the thick photoresist layer 25 from the yielded good die 45.

Figure 12:
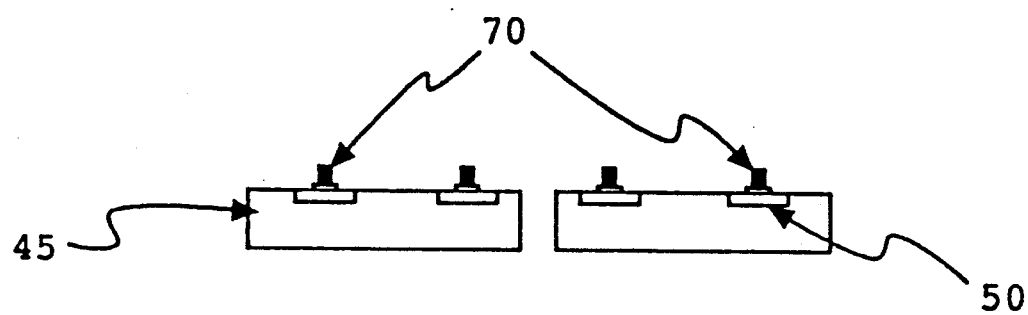
FIG. 12 illustrates the twelfth step, probing and detaching the gold bumped dies from the backing material, of a twelve step process utilizing aspects of the present invention.

FIG. 11 also illustrates that with the yielded good die 45 still attached to the backing material 55, they can be electrically probed by conventional means such as wafer probing, so that damaged die can be isolated and no longer continue being processed by attaching them to the TAB lead carrier film. This serves to further reduce packaging costs by avoiding the packaging of bad die. Finally, as shown in FIG. 12, after probing of the die 45, they are then detached from the backing material 55 and the remaining good die are ready to be attached to the TAB lead carrier film.

Although the various aspects of the present invention have been described with respect to a preferred embodiment, it will be understood that the invention is entitled to full protection within the full scope of the appended claims.

For example, the backing material 55 might not be detached, but remain attached to and be diced along with the die 45 along dotted lines 80 (FIG. 11) in order to serve as a heat sink. In this example, the backing material 55 would be a conductive sheet of metal preselected as to material and thickness for desirable heat sinking properties.

Also, in addition to the formation of conductive bumps on the bond pads of yielded good die, other applications are readily foreseeable using the various aspects of the present invention. The same approach can be used to form solder bumps in flip chip applications. It can be used to fabricate hermetic chips using the appropriate barrier metal. It can be used to incorporate power/ground planes onto die.

What is claimed is:

1. A method of forming a plurality of conductive bumps on a plurality of bond pads of at least one semiconductor die, comprising the steps of:
    forming a transparent structure, said structure having a first and second surface opposite to each other,
    forming a first masking layer on the first surface of said transparent structure, said first masking layer having an exposed surface opposite to said transparent structure,
    forming a pattern of holes in said first masking layer, said pattern matching the locations of bond pads on at least one die,
    aligning said at least one die with respect to said first masking layer such that said plurality of bond pads are visible through the second surface of said transparent structure and through said pattern of holes of said first masking layer,
    attaching said at least one die to said exposed surface of said first masking layer so that the bond pads of the die are aligned with said pattern of holes,
    separating said transparent structure from said first masking layer,
    forming said plurality of conductive bumps on the bond pads of the die through said pattern of holes of said first masking layer, and
    removing said first masking layer from said at least one die.

2. The method according to claim 1 wherein the step forming a transparent structure comprises the steps of:

placing a surface of a layer of transparent flexible material against a surface of a transparent substrate, and forming a layer of transparent metallic material on an opposite surface of said layer of transparent flexible material.

3. The method according to claim 1 wherein said first masking layer forming step includes spinning a photosensitive material onto the transparent structure.

4. The method according to claim 1 wherein said first masking layer includes a photoresist material and the step of forming a pattern of holes in said first masking layer comprises the steps of:

exposing a portion of said first masking layer to ultraviolet light, and removing said exposed portion.

5. The method of claim 4 wherein the formation of said layer of transparent metallic material comprises the step of:

sputtering or evaporative depositing a thin layer of chromium on said opposite surface of said layer of flexible material, said thin layer being only a few mono-layers thick.

6. The method according to claim 1 wherein said first masking layer consists of a photosensitive material and the step of forming a pattern of holes in said masking layer comprises the steps of:

exposing a portion of said first masking layer to ultraviolet light, and removing said exposed portion.

7. The method according to claim 6 wherein said first masking layer forming step includes placing a photo definable, polyimide layer on the first surface of said transparent structure.

8. The method according to claim 7 wherein the formation of said layer of transparent metallic material comprises the step of:

sputtering or evaporative depositing a thin layer of copper on said opposite surface of said layer of flexible material, said thin layer being only a few mono-layers thick.

9. The method according to claim 1 wherein the step of forming said plurality of conductive bumps within said pattern of holes comprises the steps of:

depositing a material upon said first masking layer and within said pattern of holes of said first masking layer to form an adhesion/barrier base layer, forming a second masking layer on said adhesion/barrier base layer, forming a pattern of holes in said second masking layer, said pattern matching the pattern formed in said first masking layer, plating said plurality of conductive bumps upon said adhesion/barrier base layer deposited within said pattern of holes, removing said second masking layer, and removing said adhesion/barrier base layer from the surface of said first masking layer, but not within said pattern of holes.

10. The method according to claim 9 wherein the step of removing said adhesion/barrier base layer is conducted simultaneously with the step of removing said first masking layer from said at least one die.

11. The method according to claim 9 wherein said conductive bump forming step includes depositing titanium, tungsten and gold material.

12. The method according to claim 9 wherein said conductive bump forming step includes plating gold material upon said adhesive/barrier base layer within said pattern of holes.

13. The method according to claim 9 wherein said conductive bump forming step includes plating nickel, copper, solder, cobalt, palladium, platinum or silver material upon said adhesive/barrier base layer within said pattern of holes.

14. The method according to claim 1 wherein the step of forming said plurality of conductive bumps within said plurality of holes comprises the steps of:

depositing a material upon said first masking layer and within said pattern of holes of said first masking layer to form an adhesion/barrier base layer, placing a contacting metal mask against the exposed surface of said adhesion/barrier base layer, sputtering or evaporative depositing said plurality of conductive bumps upon said adhesion/barrier base layer within said pattern of holes, and removing said contact metal mask and adhesion/barrier base layer from the surface of said first masking layer, but not within said pattern of holes.

15. A method as recited in claim 1 further comprising the steps of:

applying a backing material to a surface of said at least one die prior to the step of separating said transparent structure from said first masking layer, said surface to which said backing material is applied being opposite to that upon which said plurality of bond pads is situated, and electrically probing said at least one die after the step of removing said first masking layer.

16. A method as recited in claim 15 further comprising the steps of:

removing said backing material from said surface of said at least one die after electrically probing said at least one die.

* * * * *